(12) United States Patent
Hoshino et al.

(10) Patent No.: US 11,644,714 B2
(45) Date of Patent: May 9, 2023

(54) POLARIZER, METHOD OF PRODUCING POLARIZER, LAMINATE, AND IMAGE DISPLAY DEVICE

(71) Applicant: FUJIFILM Corporation, Tokyo (JP)

(72) Inventors: Wataru Hoshino, Kanagawa (JP);
Hiroshi Matsuyama, Kanagawa (JP);
Jun Takeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/007,411

(22) Filed: Aug. 31, 2020

(65) Prior Publication Data

US 2020/0400996 A1 Dec. 24, 2020

Related U.S. Application Data

(63) Continuation of application No. PCT/JP2019/012177, filed on Mar. 22, 2019.

(30) Foreign Application Priority Data

Mar. 23, 2018 (JP) .............................. JP2018-057105

(51) Int. Cl.
*G02F 1/1335* (2006.01)
*G02F 1/137* (2006.01)
*G02B 5/30* (2006.01)
*G02F 1/35* (2006.01)

(52) U.S. Cl.
CPC ...... *G02F 1/133528* (2013.01); *G02B 5/3025* (2013.01); *G02F 1/13781* (2013.01); *G02F 1/13737* (2013.01); *G02F 1/3505* (2021.01)

(58) Field of Classification Search
CPC .......... G02F 1/133528; G02F 1/13475; G02F 1/1334; G02F 1/1335; G02F 1/1337; G02F 1/13737; G02F 1/13781; G02F 1/3505; C09K 19/60; C09K 19/02; G02B 5/30; G02B 5/3016; G02B 5/3025; G02B 5/3058; G02B 5/3066; G02B 5/305; H01L 27/32; H01L 51/50; H05B 33/02; G09F 9/00

See application file for complete search history.

(56) References Cited

U.S. PATENT DOCUMENTS

| 2007/0024970 A1 | 2/2007 | Lub et al. |
| 2010/0309415 A1 | 12/2010 | Rho et al. |
| 2015/0378068 A1 | 12/2015 | Hatanaka |

FOREIGN PATENT DOCUMENTS

| JP | 2005-140986 A | 6/2005 |
| JP | 2005-189392 A | 7/2005 |
| JP | 2005-189393 A | 7/2005 |
| JP | 2010-001368 A | 1/2010 |
| JP | 4719156 B2 | 7/2011 |
| JP | 2012-083734 A | 4/2012 |
| JP | 2013-109090 A | 6/2013 |
| JP | 2016-27387 A | 2/2016 |
| JP | 2017-167517 A | 9/2017 |

OTHER PUBLICATIONS

International Search Report issued in PCT/JP2019/012177 dated Jun. 11, 2019.
Written Opinion issued in PCT/JP2019/012177 dated Jun. 11, 2019.
International Preliminary Report on Patentability completed by WIPO dated Sep. 29, 2020 in connection with International Patent Application No. PCT/JP2019/012177.
Office Action, issued by the Japanese Patent Office dated Jan. 26, 2021, in connection with Japanese Patent Application No. 2020-507946.
Office Action, issued by the Japanese Patent Office dated Aug. 31, 2021, in connection with Japanese Patent Application No. 2020-507946.
Office Action, issued by the State Intellectual Property Office dated Oct. 11, 2021, in connection with Chinese Patent Application No. 201980021021.2.

*Primary Examiner* — Thoi V Duong
(74) *Attorney, Agent, or Firm* — Jean C. Edwards; Jean C. Edwards, Esq.

(57) ABSTRACT

An object of the present invention is to provide a polarizer, a method of producing a polarizer, a laminate, and an image display device which enable achievement of both the degree of alignment and heat resistance. The polarizer of the present invention is a polarizer formed of a polarizer-forming composition which contains a liquid crystal compound and a dichroic material, in which the liquid crystal compound has a smectic liquid crystallinity, and a phase transition temperature of the polarizer-forming composition from a smectic phase to an isotropic phase or a nematic phase is 120° C. or higher.

5 Claims, No Drawings

POLARIZER, METHOD OF PRODUCING POLARIZER, LAMINATE, AND IMAGE DISPLAY DEVICE

CROSS-REFERENCE TO RELATED APPLICATIONS

This application is a Continuation of PCT International Application No. PCT/JP2019/012177 filed on Mar. 22, 2019, which was published under PCT Article 21(2) in Japanese, and which claims priority under 35 U.S.C. § 119(a) to Japanese Patent Application No. 2018-057105 filed on Mar. 23, 2018. The above applications are hereby expressly incorporated by reference, in their entirety, into the present application.

BACKGROUND OF THE INVENTION

1. Field of the Invention

The present invention relates to a polarizer, a method of producing a polarizer, a laminate, and an image display device.

2. Description of the Related Art

In the related art, in a case where an attenuation function, a polarization function, a scattering function, or a light shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is also used even in an organic light emitting diode (OLED) to prevent reflection of external light.

In the related art, iodine has been widely used as a dichroic material in these polarizers, but a polarizer that uses an organic coloring agent in place of iodine as a dichroic material has also been examined.

For example, JP4719156B describes "a guest-host polarizer, including a film of an aligned polymer which contains an aligned polymerized liquid crystal host and a guest dispersed in the host and absorbing aligned dichroic light, in which the alignment of the aligned film is alignment of a smectic phase Sx or alignment corresponding to the alignment of the smectic phase Sx (here, excluding a smectic A phase and a smectic C phase), the film of the aligned polymer has a dichroic ratio of 15 or greater, the aligned polymerized liquid crystal host is obtained by polymerizing the aligned polymerizable liquid crystal, and the polymerizable liquid crystal has trans-1-[4-[6-(acryloyloxy)hexyloxy]cyclohexanecarboxyl]-4-[4-[6-(acryloyloxy)hexyloxy] be nzoyloxy] benzene or a smectic phase Sx (here, excluding a smectic A phase and a smectic C phase)" ([claim 1]).

SUMMARY OF THE INVENTION

As a result of examination on the polarizer described in JP4719156B, the present inventors found that it is difficult to achieve both the degree of alignment and heat resistance depending on the kind of the polymerizable liquid crystal used in the host and the polymerization conditions.

Therefore, an object of the present invention is to provide a polarizer, a method of producing a polarizer, a laminate, and an image display device which enable achievement of both the degree of alignment and heat resistance.

As a result of intensive examination conducted by the present inventors in order to achieve the above-described object, it was found that a polarizer formed of a polarizer-forming composition which contains a liquid crystal compound and a dichroic material, in which the liquid crystal compound has a smectic liquid crystallinity and a phase transition temperature of the polarizer-forming composition from a smectic phase to an isotropic phase or a nematic phase is 120° C. or higher, is capable of achieving both the degree of alignment and heat resistance.

That is, the present inventors found that the above-described object can be achieved by employing the following configurations.

[1] A polarizer which is formed of a polarizer-forming composition containing a liquid crystal compound and a dichroic material, in which the liquid crystal compound has a smectic liquid crystallinity, and a phase transition temperature of the polarizer-forming composition from a smectic phase to an isotropic phase or a nematic phase is 120° C. or higher.

[2] The polarizer according to [1], in which the phase transition temperature of the polarizer-forming composition from a smectic phase to an isotropic phase or a nematic phase is 130° C. or higher.

[3] The polarizer according to [1] or [2], in which the liquid crystal compound further has a nematic liquid crystallinity.

[4] The polarizer according to any one of [1] to [3], in which a difference between an upper limit and a lower limit in a range of temperature at which the nematic phase of the polarizer-forming composition is provided is 25° C. or higher.

[5] The polarizer according to any one of [1] to [4], in which a difference between an upper limit and a lower limit in a range of temperature at which the smectic phase of the polarizer-forming composition is provided is 50° C. or higher.

[6] A method of producing the polarizer according to any one of [1] to [5], the method comprising: a coating film forming step of coating an alignment film with a polarizer-forming composition which contains a liquid crystal compound and a dichroic material to form a coating film; an aligning step of aligning a liquid crystal component contained in the coating film in a liquid crystal state; and a cooling step of cooling the coating film to a temperature range of 20° C. to 25° C. at a cooling rate of 3° C./sec or greater from the liquid crystal state to obtain a polarizer.

[7] A laminate comprising: a base material; an alignment film; and the polarizer according to any one of [1] to [5].

[8] An image display device comprising: the polarizer according to any one of [1] to [5] or the laminate according to [7]; and an image display element.

According to the present invention, it is possible to provide a polarizer, a method of producing a polarizer, a laminate, and an image display device which enable achievement of both the degree of alignment and heat resistance.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, the term parallel or orthogonal does not indicate parallel or orthogonal in a strict sense, but indicates a range of ±5° from parallel or orthogonal.

Further, in the present specification, the concepts of the liquid crystal composition and the liquid crystal compound also include those that no longer exhibit liquid crystallinity due to curing or the like.

In the present specification, respective components may be used alone or in combination of two or more kinds thereof. Here, in a case where two or more kinds of respective components are used in combination, the content of the components indicates the total content unless otherwise specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Polarizer]

A polarizer according to the embodiment of the present invention is a polarizer formed of a polarizer-forming composition which contains a liquid crystal compound and a dichroic material.

In the present invention, the liquid crystal compound is a compound having a smectic liquid crystallinity.

Further, in the present invention, the phase transition temperature of the polarizer-forming composition from a smectic phase to an isotropic phase or a nematic phase is 120° C. or higher.

Here, in the present invention, a value measured by the following method is employed as the phase transition temperature.

Two polarizers of an optical microscope (ECLIPSE E600 POL, manufactured by Nikon Corporation) are disposed so as to be orthogonal to each other, and a sample table is set between the two polarizers.

Further, a small amount of the polarizer-forming composition is placed on slide glass, and the slide glass is set on a hot stage placed on the sample table.

The composition is observed using a microscope while the temperature of the hot stage is raised from 25° C. at 5° C./min, and the temperature at which phase transition from the crystal phase to the smectic phase has occurred and the temperature at which phase transition from the smectic phase to the nematic phase or the isotropic phase has occurred from the texture are recorded.

In the present invention, in a case where the liquid crystal compound contained in the polarizer-forming composition has a smectic liquid crystallinity and the phase transition temperature of the polarizer-forming composition from the smectic phase to the isotropic phase or the nematic phase is 120° C. or greater, both the degree of alignment and heat resistance of a polarizer to be formed can be achieved.

The reason for this is not clear, but the present inventors presume as follows.

First, in a case where a known polarizer-forming composition of the related art which contains a liquid crystal compound and a dichroic material is used, it is known that a curing treatment is performed in order to fix the alignment state of the liquid crystal component.

Here, the heat resistance can be typically improved by promoting the curing. However, in a case where the curing excessively proceeds, the alignment of the liquid crystal compound and the dichroic material is disturbed due to the influence of the curing shrinkage, and thus the degree of alignment is decreased. That is, in order to improve the heat resistance while suppressing the decrease in the degree of alignment, there is a limit to the means for promoting the curing.

On the contrary, in the present invention, the alignment state can be fixed by predetermined cooling means by setting the phase transition temperature of the polarizer-forming composition from the smectic phase to the isotropic phase or the nematic phase to 120° C. or higher. As the result, it is considered that the heat resistance can be improved while the decrease in the degree of alignment is suppressed.

In the present invention, from the viewpoint of more easily achieving both the degree of alignment and heat resistance, the phase transition temperature of the polarizer-forming composition from the smectic phase to the isotropic phase or the nematic phase is preferably 130° C. or higher. Further, the upper limit of the temperature is not particularly limited, but is typically preferably 200° C. or lower.

Further, in the present invention, from the viewpoint of suppressing the haze of a polarizer to be formed or a laminate including the polarizer, the difference between the upper limit and the lower limit in a range of temperature at which the nematic phase of the polarizer-forming composition is provided is preferably 25° C. or higher.

The reason why the haze is suppressed is not clear, but the present inventors presume as follows.

That is, the polarizer-forming composition is in a non-aligned state after being applied in a case of forming a polarizer, but it is considered that a highly aligned state is easily formed because the fluidity of the polarizer-forming composition is increased in a case where the difference between the upper limit and the lower limit in a range of temperature at which the nematic phase of the polarizer-forming composition is provided is 25° C. or higher.

Further, in the present invention, from the viewpoints of increasing the degree of alignment and improving the surface state, the difference between the upper limit and the lower limit in a range of temperature at which the smectic phase of the polarizer-forming composition is provided is preferably 50° C. or higher.

Hereinafter, the liquid crystal compound, the dichroic material, and optional components which are contained in the polarizer-forming composition will be described.

[Liquid Crystal Compound]

The liquid crystal compound contained in the polarizer-forming composition is a compound having a smectic liquid crystallinity.

Here, in the present invention, the "compound having a smectic liquid crystallinity" indicates a compound capable of exhibiting a liquid crystal state in a smectic phase. Further, the smectic phase means that molecules aligned in one direction have a layer structure.

In the present invention, from the viewpoint that both the degree of alignment and heat resistance of a polarizer to be formed can be achieved at a high level, it is preferable that the liquid crystal compound contained in the polarizer-forming composition is a compound further having a nematic liquid crystallinity.

Here, in the present invention, the "compound having a nematic liquid crystallinity" indicates a compound capable of exhibiting a liquid crystal state of a nematic phase. Further, the nematic phase means that the constituent molecules have an alignment order but do not have a three-dimensional positional order.

It can be confirmed that the liquid crystal compound has a smectic property and a nematic property, for example, by observing structures unique to the smectic phase and the nematic phase using an optical microscope.

As such a liquid crystal compound, both a low-molecular-weight liquid crystal compound and a polymer liquid crystal compound can be used.

Here, the "low-molecular-weight liquid crystal compound" indicates a liquid crystal compound having no repeating units in the chemical structure. Further, the "polymer liquid crystal compound" indicates a liquid crystal compound having repeating units in the chemical structure.

Suitable specific examples of the low-molecular-weight liquid crystal compound are as follows.

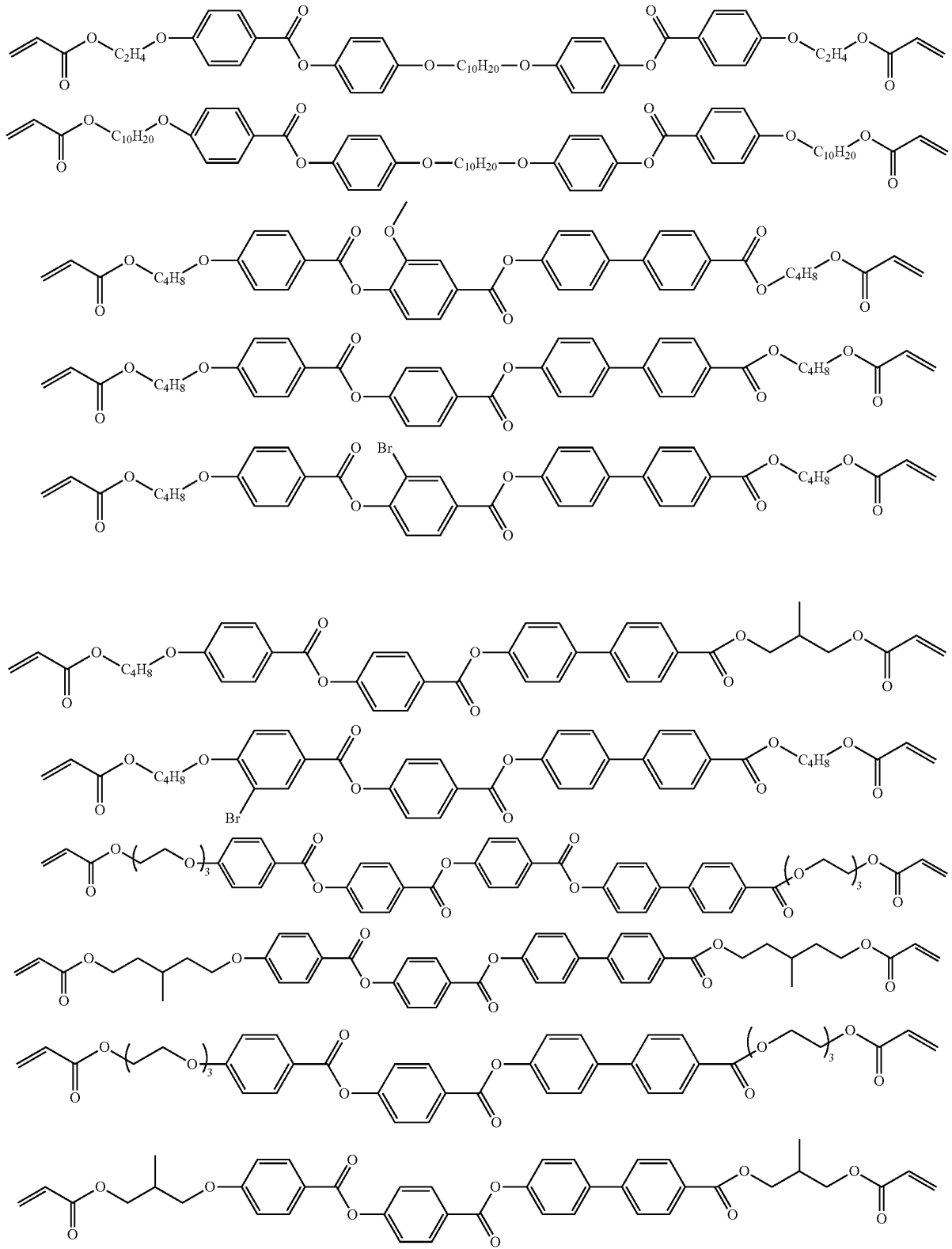

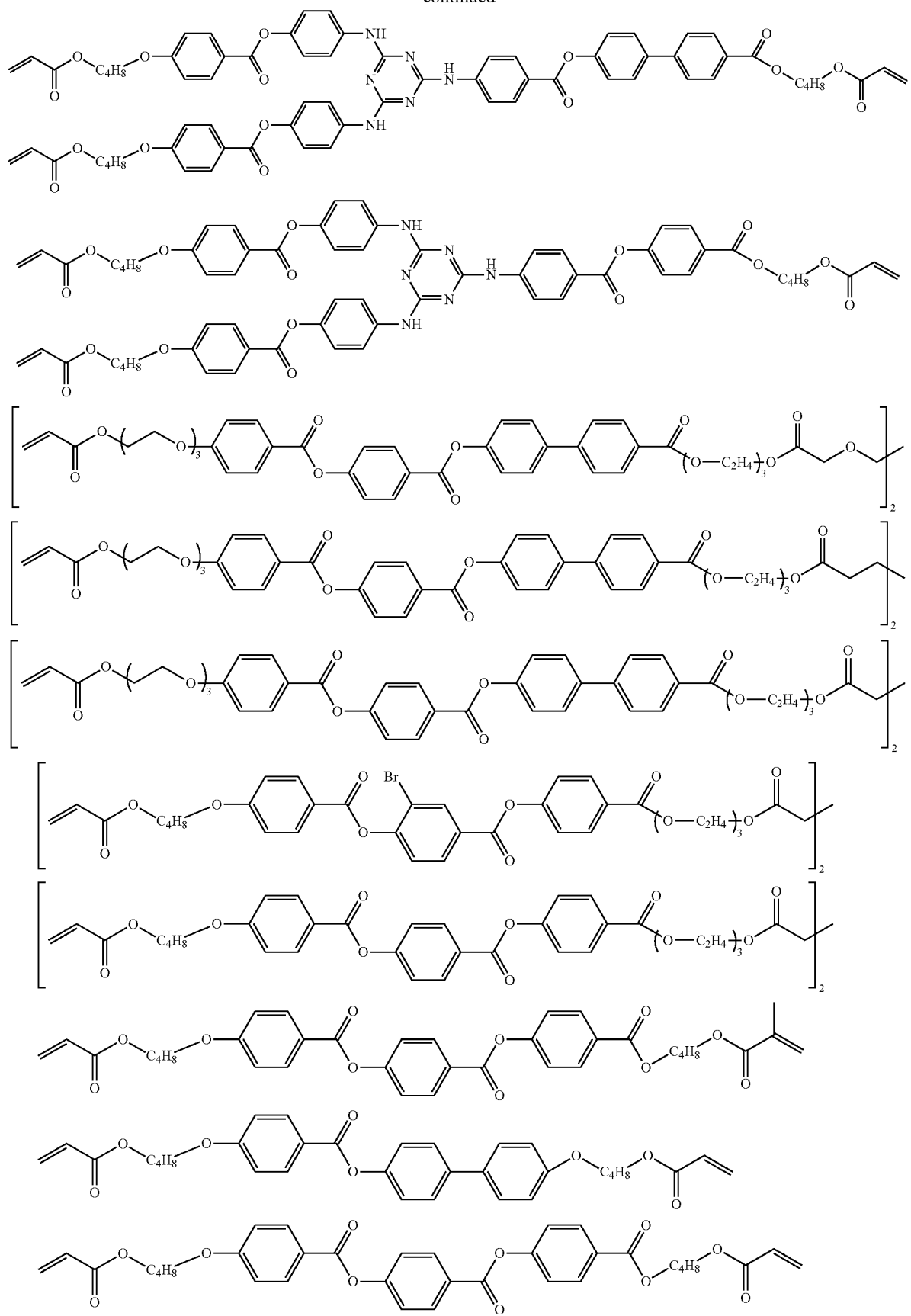

-continued
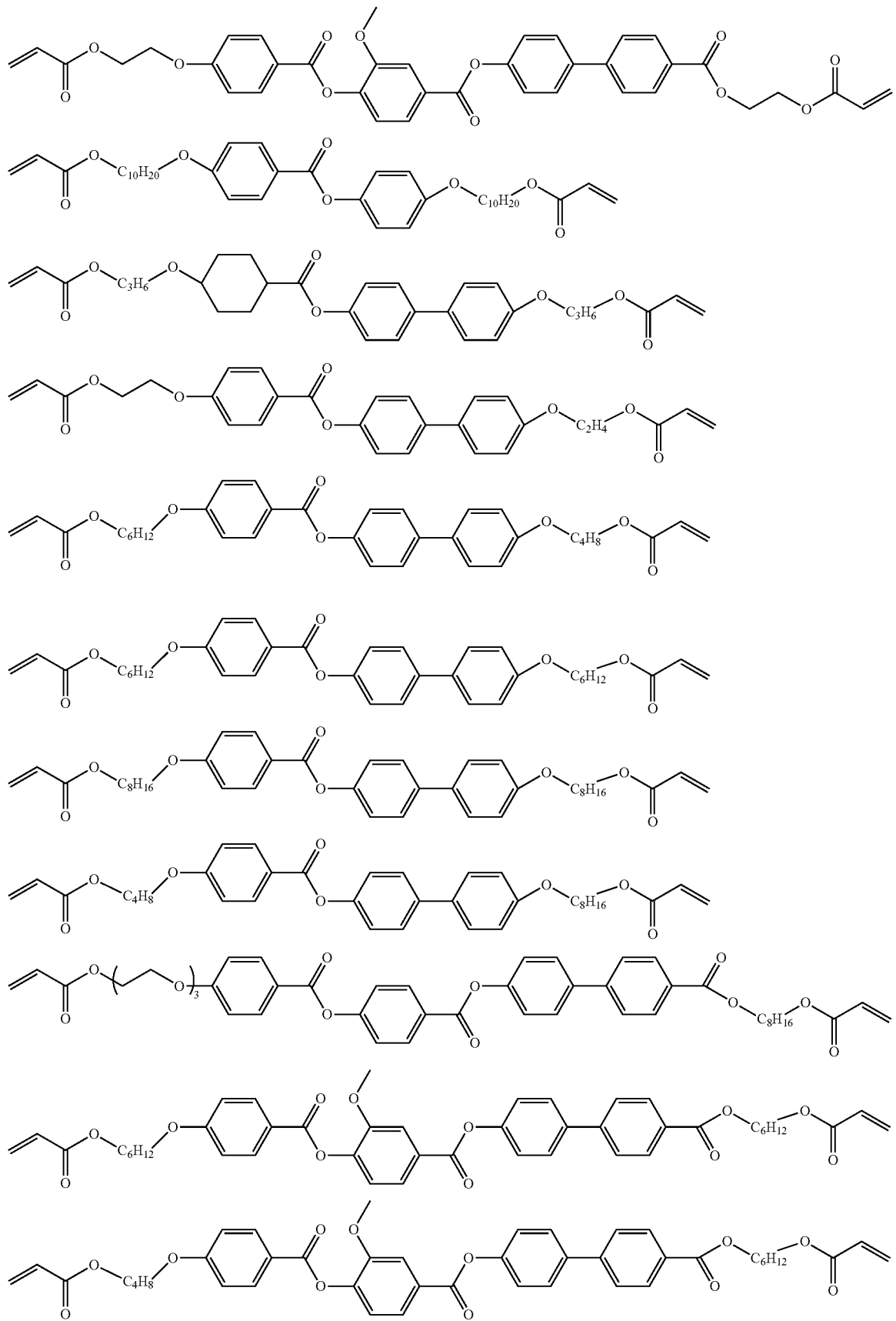

-continued

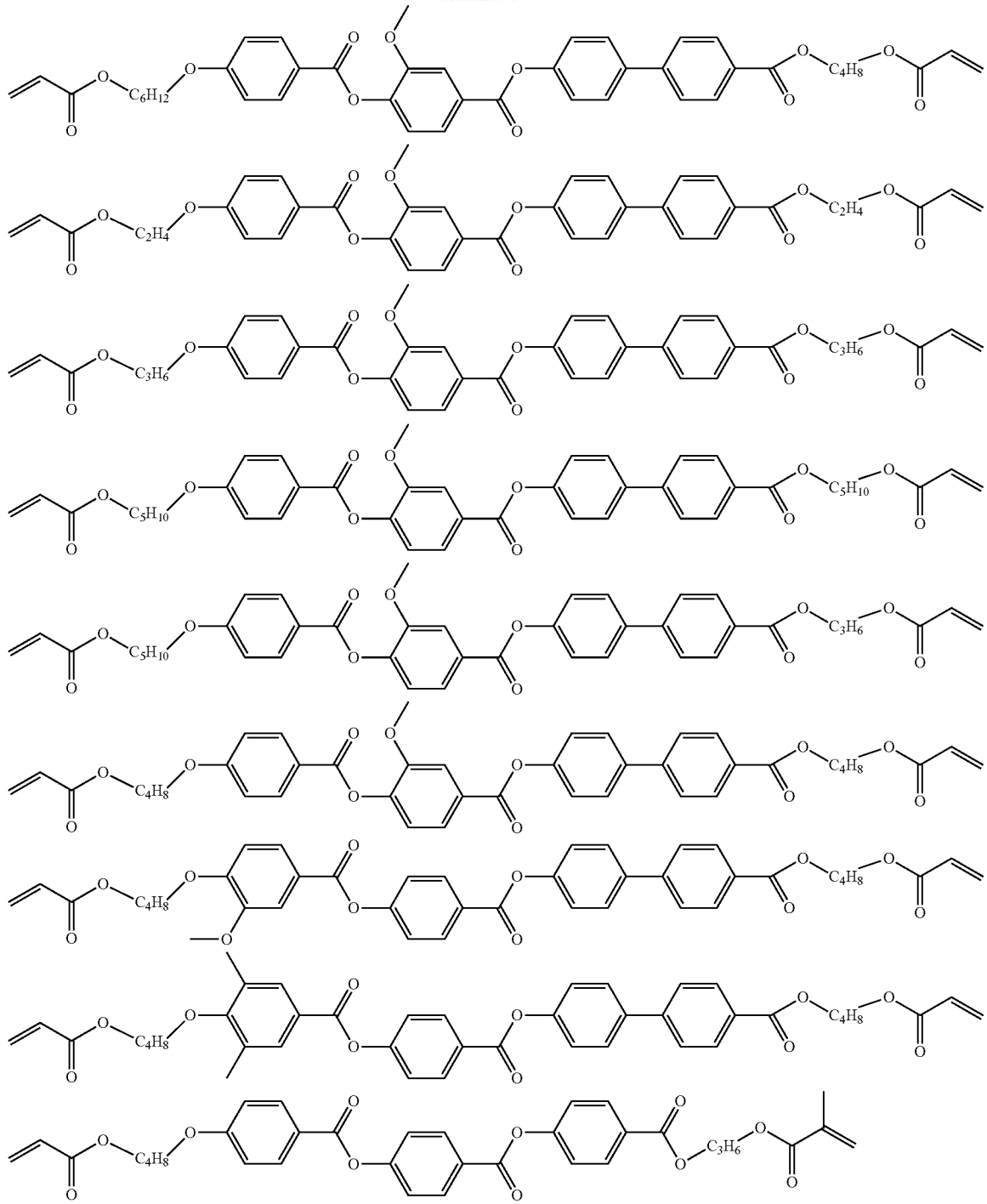

It is preferable that the polymer liquid crystal compound is a liquid crystal compound having a weight-average molecular weight of 3000 or greater.

Here, the weight-average molecular weight in the present invention is a value measured under the following conditions according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used Further, it is preferable that the polymer liquid crystal compound is a copolymer having two or more different repeating units.

Suitable examples of the polymer liquid crystal compound include compounds having the following repeating units.
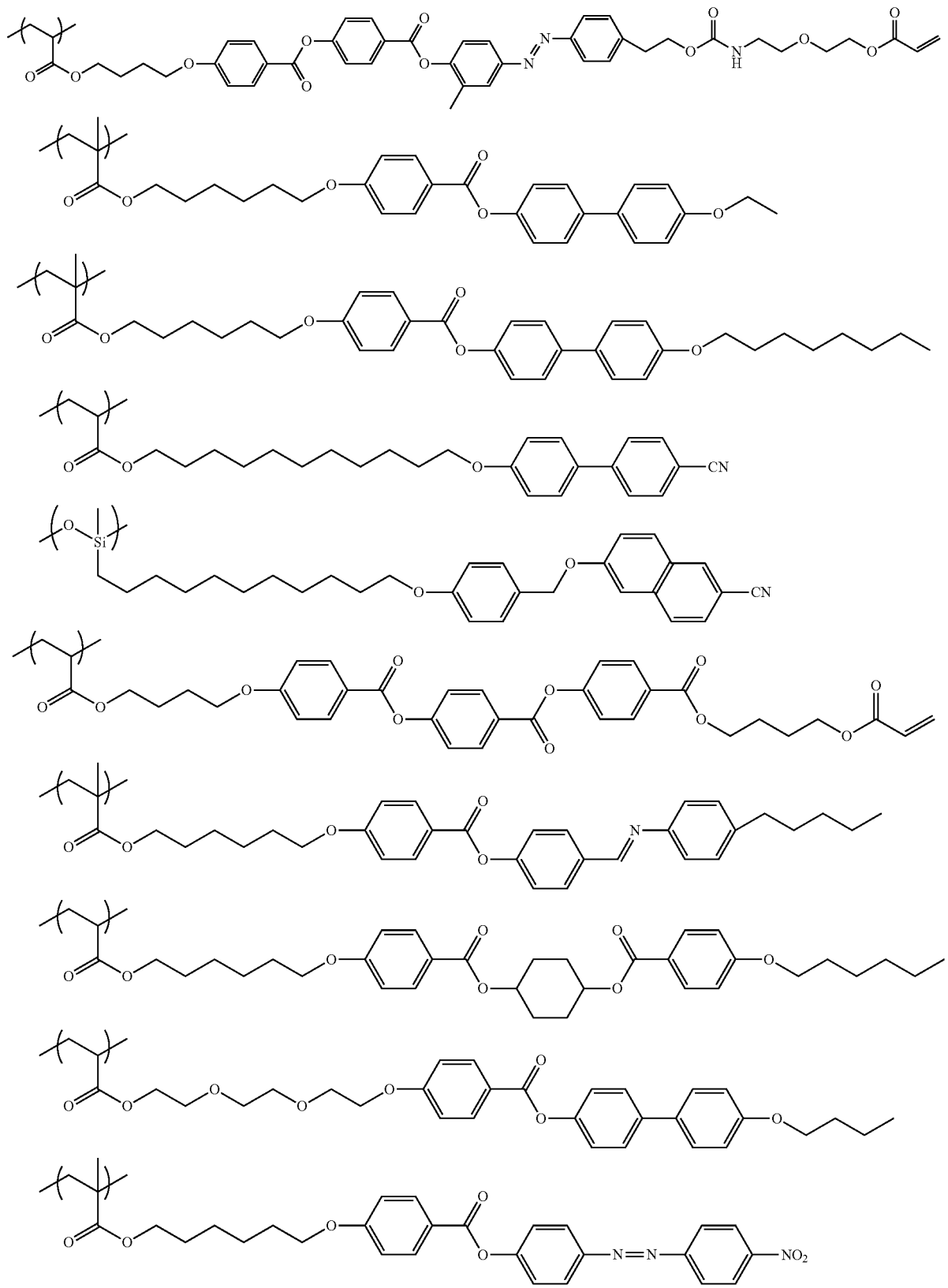

-continued
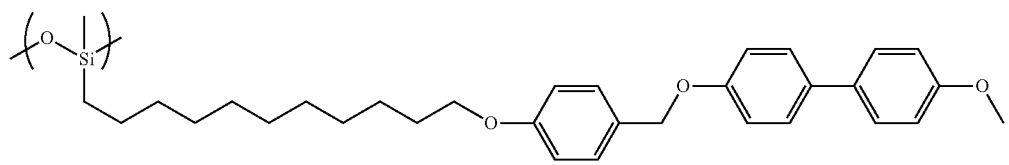
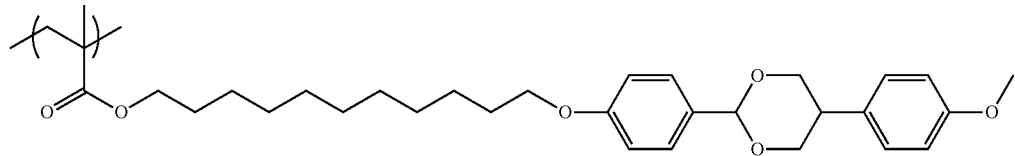
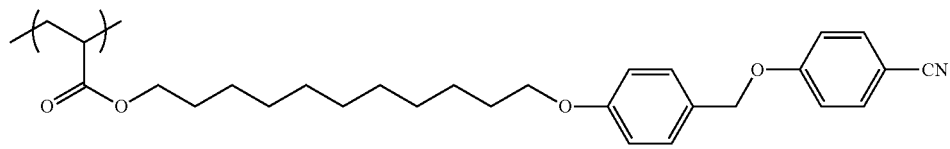
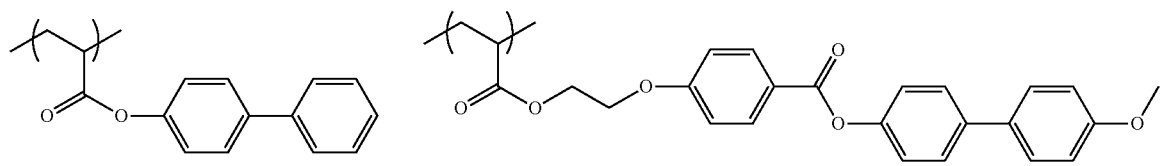
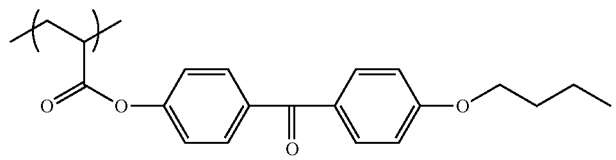
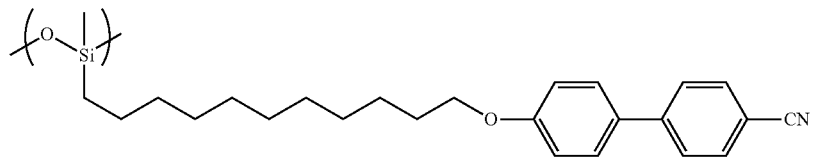
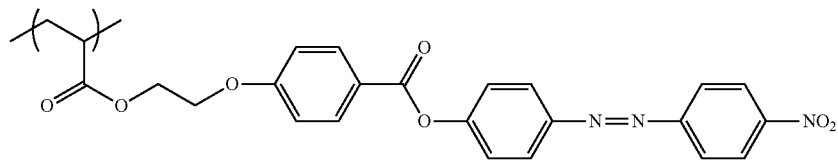
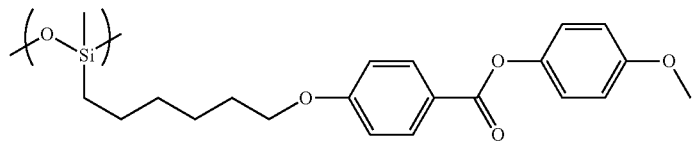
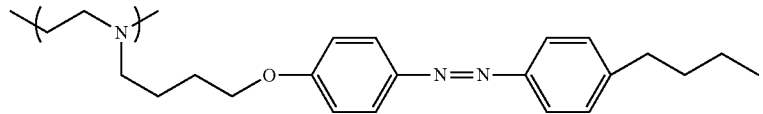
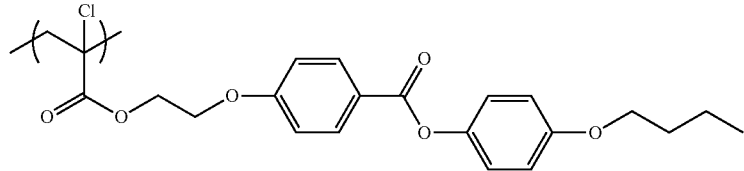
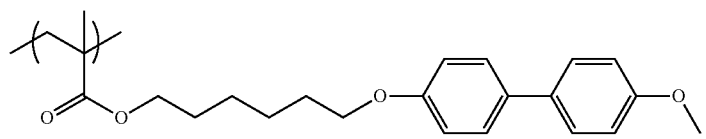

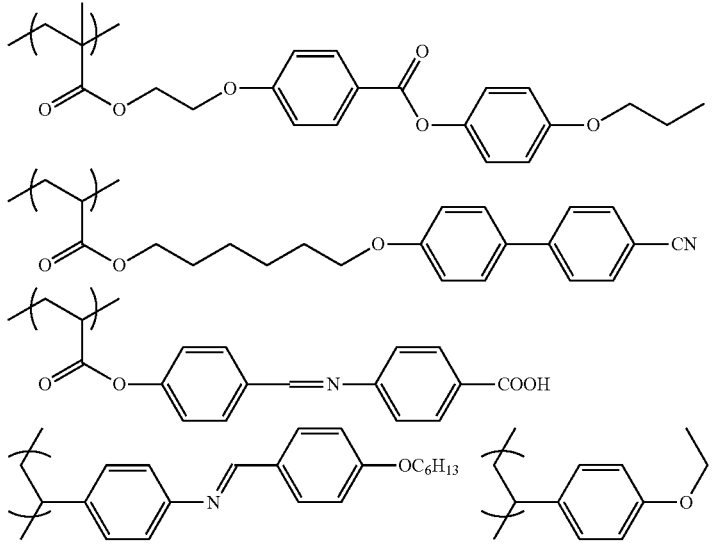

[Dichroic Material]

The dichroic material contained in the polarizer-forming composition is not particularly limited, and examples thereof include a visible light absorbing material (dichroic coloring agent), a luminescent material (such as a fluorescent material or a phosphorescent material), an ultraviolet absorbing material, an infrared absorbing material, a non-linear optical material, a carbon nanotube, and an inorganic material (for example, a quantum rod). Further, known dichroic materials (dichroic coloring agents) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [J0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO 2016/136561A, paragraphs [0014] to [0033] of WO2017/154835A, paragraphs [0014] to [0033] of WO2017/154695A, and paragraphs [0013] to [0037] of WO2017/195833A.

In the present invention, two or more kinds of dichroic materials may be used in combination. For example, from the viewpoint of making the color of the polarizer closer to black, it is preferable that at least one dichroic material having a maximum absorption wavelength in a wavelength range of 370 to 550 nm and at least one dichroic material having a maximum absorption wavelength in a wavelength range of 500 to 700 nm are used in combination.

The dichroic material may contain a crosslinkable group.

Specific examples of the crosslinkable group include a (meth)acryloyl group, an epoxy group, an oxetanyl group, and a styryl group. Among these, a (meth)acryloyl group is preferable.

From the viewpoint of more easily achieving both the degree of alignment and heat resistance, the content of the dichroic material contained in the polarizer-forming composition is preferably in a range of 1 to 400 parts by mass, more preferably in a range of 2 to 100 parts by mass, still more preferably in a range of 5 to 30 parts by mass, and particularly preferably in a range of 10 to 30 parts by mass with respect to 100 parts by mass of the liquid crystal compound. It is preferable that the concentration of a coloring agent is increased because the light fastness tends to be improved.

Further, the concentration of the dichroic material is preferably 4% by mass or greater with respect to the total mass of the liquid crystal compound and the dichroic material.

[Solvent]

From the viewpoint of workability or the like, it is preferable that the polarizer-forming composition contains a solvent.

Examples of the solvent include ketones (such as acetone, 2-butanone, methyl isobutyl ketone, cyclopentanone, and cyclohexanone), ethers (such as dioxane, tetrahydrofuran, tetrahydropyran, dioxolane, tetrahydrofurfuryl alcohol, and cyclopentyl methyl ether), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, butyl acetate, and diethyl carbonate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), organic solvents such as heterocyclic compounds (such as pyridine), and water. These solvents may be used alone or in combination of two or more kinds thereof.

In a case where the polarizer-forming composition contains a solvent, the content of the solvent is preferably in a range of 80% to 99% by mass, more preferably in a range of 83% to 97% by mass, and particularly preferably in a range of 85% to 95% by mass with respect to the total mass of the polarizer-forming composition.

[Interface Modifier]

From the viewpoint of more easily achieving the degree of alignment and heat resistance, it is preferable that the polarizer-forming composition contains an interface modifier. In a case where the composition contains an interface modifier, the smoothness of the coated surface is improved, the degree of alignment is improved, and cissing and unevenness are suppressed so that the in-plane uniformity is expected to be improved.

As the interface modifier, those obtained by allowing liquid crystal compounds to be horizontally aligned are preferable, and compounds (horizontal alignment agents) described in paragraphs [0253] to [0293] of JP2011-237513A can be used. Further, fluorine (meth)acrylate-based polymers described in [0018] to [0043] of JP2007-272185A can also be used. Compounds other than the compounds described above may be used as the interface modifier.

In a case where the polarizer-forming composition contains an interface modifier, from the viewpoint of more easily achieving the degree of alignment and heat resistance, the content of the interface modifier is preferably in a range of 0.001 to 5 parts by mass and more preferably in a range of 0.01 to 3 parts by mass with respect to 100 parts by mass which is the total amount of the liquid crystal compound and the dichroic material in the composition.

[Polymerization Initiator]

From the viewpoint of more easily achieving the degree of alignment and heat resistance, it is preferable that the polarizer-forming composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the polarizer-forming composition contains a polymerization initiator, from the viewpoint of more easily achieving the degree of alignment and heat resistance, the content of the polymerization initiator is preferably in a range of 0.01 to 30 parts by mass and more preferably in a range of 0.1 to 15 parts by mass with respect to 100 parts by mass which is the total amount of the liquid crystal compound and the dichroic material in the composition. The durability of the polarizer is excellent in a case where the content of the polymerization initiator is 0.01 parts by mass or greater, and the alignment of the polarizer is further enhanced in a case where the content of the polymerization initiator is 30 parts by mass or less.

[Thickness]

From the viewpoint of more easily achieving the degree of alignment and heat resistance, the film thickness of the polarizer according to the embodiment of the present invention is preferably in a range of 0.1 to 5.0 µm and more preferably in a range of 0.3 to 1.5 µm. Although it depends on the concentration of the dichroic material in the polarizer-forming composition, a polarizer with an excellent absorbance is obtained in a case where the film thickness is 0.1 µm or greater, and a polarizer with an excellent transmittance is obtained in a case where the film thickness is 5.0 µm or less.

[Method of Producing Polarizer]

The method of producing the polarizer according to the embodiment of the present invention is not particularly limited, but it is preferable that the polarizer is prepared using the method described below (hereinafter, referred to as the "method of producing the polarizer according to the embodiment of the present invention") from the viewpoint that the degree of alignment of the polarizer to be obtained is further increased and the haze is unlikely to be observed.

The method for producing the polarizer according to the embodiment of the present invention is a production method including a coating film forming step of coating an alignment film with the above-described polarizer-forming composition to form a coating film, an aligning step of aligning a liquid crystal component contained in the coating film in a liquid crystal state, and a cooling step of cooling the coating film to a temperature range of 20° C. to 25° C. at a cooling rate of 3° C./sec or greater from the liquid crystal state to obtain a polarizer.

Hereinafter, each step will be described.

[Coating Film Forming Step]

The coating film forming step is a step of coating the alignment film with the above-described polarizer-forming composition to form a coating film.

The alignment film can be easily coated with the polarizer-forming composition by using the polarizer-forming composition which contains the above-described solvent or using a liquid such as a melt obtained by heating the polarizer-forming composition.

Examples of the method of coating the alignment film with the polarizer-forming composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

<Alignment Film>

The alignment film used in the coating film forming step may be any film as long as the film allows the liquid crystal compound and the dichroic material contained in the polarizer-forming composition to be horizontally aligned.

An alignment film can be provided by means such as a rubbing treatment performed on a film surface of an organic compound (preferably a polymer), oblique deposition of an inorganic compound, formation of a layer having micro-grooves, or accumulation of an organic compound (such as ω-tricosanoic acid, dioctadecylmethylammonium chloride, or methyl stearylate) according to a Langmuir-Blodgett method (LB film).

Further, an alignment film in which an alignment function is generated by application of an electric field, application of a magnetic field, or irradiation with light is also known.

Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(Rubbing Treatment Alignment Film)

A polymer material used for the alignment film formed by performing a rubbing treatment is described in a plurality of documents, and a plurality of commercially available products can be used. In the present invention, polyvinyl alcohol or polyimide and derivatives thereof are preferably used. The alignment film can refer to the description on page 43, line 24 to page 49, line 8 of WO2001/088574A1. The thickness of the alignment film is preferably in a range of 0.01 to 10 μm and more preferably in a range of 0.01 to 1 μm.

(Photo-Alignment Film)

A photo-alignment material used for an alignment film formed by irradiation with light is described in a plurality of documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In this specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic material polarizing plate, or a wire grid polarizing plate), a method of using a prism-based element (for example, a Glan-Thompson prism) or a reflective polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0 to 90° (vertical) and more preferably in a range of 40 to 90°.

In a case where light to be applied is non-polarized light, the alignment film is irradiated with non-polarized light obliquely. The incidence angle is preferably in a range of 10 to 80°, more preferably in a range of 20 to 60°, and still more preferably in a range of 30 to 50°. The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

[Aligning Step]

The aligning step is a step of aligning the liquid crystal component contained in the coating film in a liquid crystal state. Further, in a case where the above-described dichroic material has a liquid crystallinity, the liquid crystal component is a component that contains not only the above-described liquid crystal compound but also the dichroic material having a liquid crystallinity.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

It is preferable that the aligning step includes a heat treatment. In this manner, the dichroic material contained in the coating film is further aligned, and the degree of alignment of the polarizer to be obtained is increased.

From the viewpoints of the manufacturing suitability and the like, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

[Cooling Step]

The cooling step is a step of cooling the coating film to a temperature range of 20° C. to 25° C. at a cooling rate of 3° C./sec or greater from the liquid crystal state to obtain a polarizer. In this manner, the alignment of the dichroic material contained in the coating film is further fixed, and the degree of alignment of the polarizer to be obtained is further increased.

Here, a cooling rate of 3° C./sec indicates lowering the temperature by 3° C. in 1 second.

The cooling rate in the cooling step is preferably 5° C./sec or greater.

Further, the cooling rate is a so-called average rate. Therefore, in the middle of the process of cooling the coating film, a time for cooling the coating film at a cooling rate lower than the predetermined cooling rate may be provided.

In this case, the cooling rate averaged in any of the above-described temperature sections may be the predetermined cooling rate. Further, there is basically no upper limit for the cooling rate in the cooling step. Therefore, it is preferable to cool the coating film as quickly as possible within a range where a defect such as degeneration of each part of the laminate having the coating film or wrinkles does not occur.

In the cooling step, the coating film is cooled within a time range of 0.01 seconds to 110 seconds, preferably 0.01 seconds to 40 seconds, more preferably 0.01 seconds to 25 seconds, and particularly preferably 0.01 seconds to 10 seconds.

Further, it is preferable that the cooling step is a step performed immediately after the aligning step. That is, it is preferable that the cooling step is performed immediately after the aligning step without performing a step accompanying a change in temperature of the coating film or a step accompanying a change in state of the coating film after the aligning step and before the start of the cooling step.

The cooling means is not particularly limited, and the cooling can be performed using a known method.

The polarizer according to the embodiment of the present invention can be obtained by performing the above-described steps.

[Other Steps]

The method of producing the polarizer according to the embodiment of the present invention may include a step of curing the polarizer after the aligning step (hereinafter, also referred to as a "curing step").

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits ray with only a specific wavelength.

Further, the exposure may be performed in a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate according to the embodiment of the present invention includes a base material, an alignment film provided on the base material, and the above-described polarizer according to the embodiment of the present invention provided on the alignment film.

Further, the laminate according to the embodiment of the present invention may include a λ/4 plate on the polarizer according to the embodiment of the present invention.

Further, the laminate according to the embodiment of the present invention may include a barrier layer between the polarizer according to the embodiment of the present invention and the λ/4 plate.

Hereinafter, each layer constituting the laminate according to the embodiment of the present invention will be described.

[Base Material]

The base material can be appropriately selected, and examples thereof include a glass substrate and a polymer film. The light transmittance of the base material is preferably 80% or greater.

In a case where a polymer film is used as the base material, it is preferable to use an optically isotropic polymer film.

As specific examples and preferred embodiments of the polymer, the description in paragraph [0013] of JP2002-022942A can be applied.

Further, even in a case of a polymer easily exhibiting the birefringence such as polycarbonate and polysulfone which has been known in the related art, a polymer with the expression property which has been reduced by modifying the molecules described in WO2000/026705A can be used.

[Alignment Film]

The alignment film is the same as that described in the above-described coating film forming step, and thus the description thereof will not be repeated.

[Polarizer]

The polarizer according to the embodiment of the present invention is as described above, and thus the description will not be repeated.

[λ/4 Plate]

A "λ/4 plate" is a plate having a λ/4 function, specifically, a plate having a function of converting linearly polarized light having a specific wavelength into circularly polarized light (or converting circularly polarized light into linearly polarized light).

Specific examples of a form in which a λ/4 plate has a single-layer structure include a stretched polymer film and a phase difference film in which an optically anisotropic layer having a λ/4 function is provided on a support. Further, specific examples of a form in which a λ/4 plate has a multilayer structure include a broadband λ/4 plate obtained by laminating a λ/4 plate and λ/2 plate.

The λ/4 plate and the polarizer according to the embodiment of the present invention may be provided in contact with each other, or another layer may be provided between the λ/4 plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate according to the embodiment of the present invention comprises a barrier layer, the barrier layer is provided between the polarizer according to the embodiment of the present invention and the λ/4 plate. Further, in a case where a layer other than the barrier layer (for example, a pressure sensitive adhesive layer or an adhesive layer) is comprised between the polarizer according to the embodiment of the present invention and the λ/4 plate, the barrier layer can be provided, for example, between the polarizer according to the embodiment of the present invention and the layer other than the barrier layer.

The barrier layer is also referred to as a gas barrier layer (oxygen barrier layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate according to the embodiment of the present invention can be used as a polarizing element (polarizing plate) or the like, for example, as a linear polarizing plate or a circularly polarizing plate.

In a case where the laminate according to the embodiment of the present invention does not include an optically anisotropic layer such as the λ/4 plate, the laminate can be used as a linear polarizing plate.

Meanwhile, in a case where the laminate according to the embodiment of the present invention includes the λ/4 plate, the laminate can be used as a circularly polarizing plate.

[Image Display Device]

An image display device according to the embodiment of the present invention is an image display device including the above-described polarizer according to the embodiment of the present invention or the above-described laminate according to the embodiment of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device according to the embodiment of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate according to the embodiment of the present invention (here, the laminate does not include a λ/4 plate) and a liquid crystal cell is more suitable.

In the present invention, between the polarizing elements provided on both sides of the liquid crystal cell, it is preferable that the laminate according to the embodiment of the present invention is used as a front-side polarizing element and more preferable that the laminate according to the embodiment of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystalline molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystalline molecules are substantially vertically aligned at the time of no voltage application. The concept of the liquid crystal cell in a VA mode includes (1) a liquid crystal cell in a VA mode in a narrow sense where rod-like liquid crystalline molecules are aligned substantially vertically at the time of no voltage application and substantially horizontally at the time of voltage application (described in JP1990-176625A (JP-H02-176625A)), (2) a liquid crystal cell (in an MVA mode) (S1D97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystalline molecules are substantially vertically aligned at the time of no voltage application and twistedly multi-domain aligned at the time of voltage application (described in proceedings of Japanese Liquid Crystal Conference, pp. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, and a polymer-sustained alignment (PSA) type. Details of these modes are described in JP2006-215326A and JP2008-538819A.

In the liquid crystal cell in an IPS mode, rod-like liquid crystalline molecules are aligned substantially parallel to the substrate, and the liquid crystalline molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-054982A (JP-H10-054982A), JP1999-202323A (JP-H11-202323A), JP1997-292522A (JP-H09-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Example 1

[Preparation of transparent support 1] A TAC base material (product name, "TG40", manufactured by FUJIFILM Corporation) having a thickness of 40 μm was continuously coated with an alignment film coating solution having the following composition using a #8 wire bar.

Thereafter, the base material was dried with warm air at 100° C. for 2 minutes, thereby obtaining a transparent support 1 in which a polyvinyl alcohol (PVA) alignment film having a thickness of 0.8 μm was formed on the TAC base material.

Further, modified polyvinyl alcohol was added to the alignment film coating solution such that the concentration of solid contents was set to 4% by mass.

| Alignment film coating solution |
|---|
| Modified polyvinyl alcohol shown below |
| Water: 70 parts by mass |
| Methanol: 30 parts by mass |

Modified polyvinyl alcohol

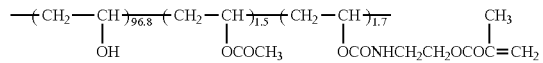

[Preparation of Alignment Film 1]
41.6 parts by mass of butoxyethanol, 41.6 parts by mass of dipropylene glycol monomethyl ether, and 15.8 parts by mass of pure water were added to 1 part by mass of a photo-alignment material E-1 having the following structure, and the obtained solution was filtered using a 0.45 μm membrane filter under pressure, thereby preparing a composition 1 for forming an alignment film.

Thereafter, the transparent support 1 was coated with the obtained composition 1 for forming an alignment film and dried at 60° C. for 1 minute. Next, the obtained coating film was irradiated with linearly polarized ultraviolet rays (illuminance of 4.5 mW, irradiation dose of 500 mJ/cm$^2$) using a polarized ultraviolet ray exposure device, thereby preparing an alignment film 1.

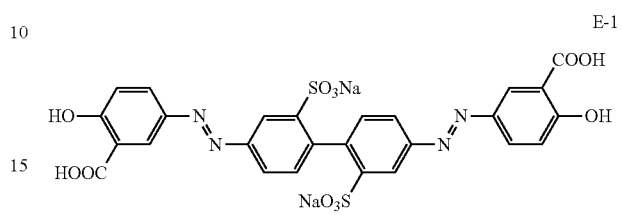

E-1

[Preparation of Polarizer 1]
The obtained alignment film 1 was continuously coated with the composition 1 for forming a polarizer having the following composition using a #7 wire bar to form a coating film 1.

Next, the coating film 1 was heated at the heating temperature listed in Table 2 for 40 seconds, the liquid crystal components contained in the coating film 1 were aligned in a liquid crystal state, and the coating film 1 was cooled to room temperature (25° C.) at the cooling rate listed in Table 2.

Next, the coating film 1 was heated at 80° C. for 30 seconds and cooled to room temperature again.

Thereafter, the coating film 1 was irradiated under an irradiation condition of an illuminance of 28 mW/cm2 for 60 seconds using a high-pressure mercury lamp, thereby preparing a polarizer 1 on the alignment film 1.

| [Composition 1 for forming polarizer] | |
|---|---|
| Liquid crystal compound L1 shown below: | 5.350 parts by mass |
| First dichroic material Y1 shown below: | 0.122 parts by mass |
| Second dichroic material M1 shown below: | 0.182 parts by mass |
| Third dichroic material C1 shown below: | 0.243 parts by mass |
| Interface modifier F1 shown below: | 0.051 parts by mass |
| Polymerization initiator J1 shown below: | 0.049 parts by mass |
| Chloroform: | 84.600 parts by mass |
| Tetrahydrofuran: | 9.400 parts by mass |

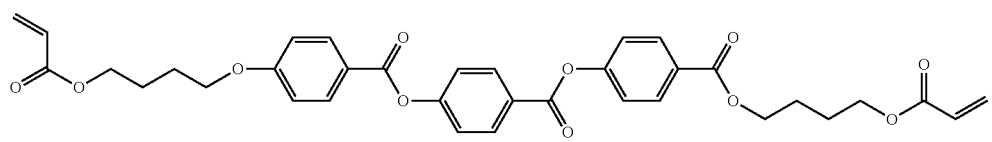

L1

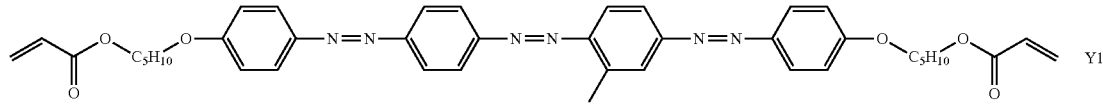

Y1

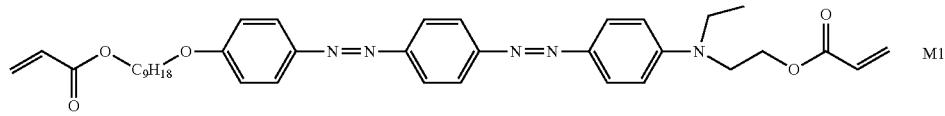

M1

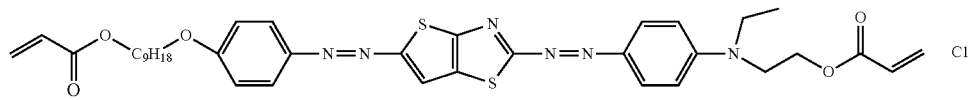

C1

[Composition 1 for forming polarizer]

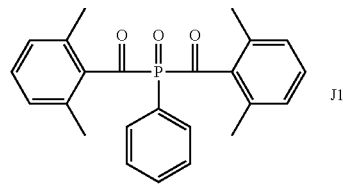 [SMILES: Cc1cccc(C)c1C(=O)P(=O)(C(=O)c1c(C)cccc1C)c1ccccc1]

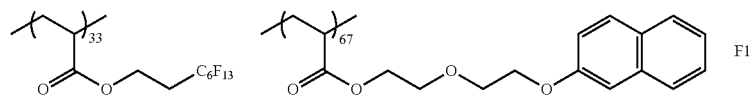

[Formation of Transparent Resin Layer (Barrier Layer) 1]

The polarizer 1 was continuously coated with the following curable composition 1 using a #2 wire bar and dried at 60° C. for 5 minutes.

Next, the polarizer 1 was irradiated under an irradiation condition of an illuminance of 28 mW/cm$^2$ for 60 seconds using a high-pressure mercury lamp so that the curable composition 1 was cured, thereby preparing a laminate in which a transparent resin layer (barrier layer) 1 was formed on the polarizer 1. Next, blue plate glass was attached to the laminate through a pressure sensitive adhesive, thereby obtaining a laminate of Example 1.

The cross section of the transparent resin layer 1 was cut using a microtome cutting machine, and the film thickness thereof was measured by observation with a scanning electron microscope (SEM), and the film thickness was approximately 1.0 μm.

| Curable composition 1 | |
|---|---|
| Polymerizable compound KAYARAD PET-30 (manufactured by Nippon Kayaku Co., Ltd.): | 29 parts by mass |
| Polymerization initiator, IRGACURE 819 (manufactured by BASF SE): | 1 part by mass |
| Alumina ethanol sol A2K5-10 (manufactured by Kawaken Fine Chemicals Co., Ltd., colloid liquid obtained by dispersing columnar alumina hydrate particles in liquid): | 70 parts by mass |

KAYARAD PET-30

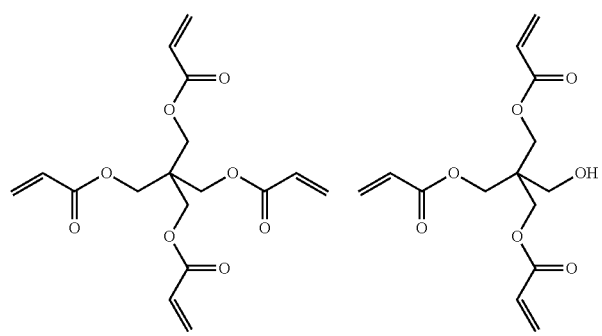

Examples 2 to 7 and Comparative Examples 1 and 2

A polarizer and a laminate corresponding to each example and each comparative example were prepared in the same manner as in Example 1 except that the kind of the liquid crystal compound or the like and the blending amount thereof (parts by mass) were changed to those listed in Table 1 and conditions for preparing the polarizer were changed to those listed in Table 2. Further, the structures of the liquid crystal compounds L2 to L7 are shown below.

L2
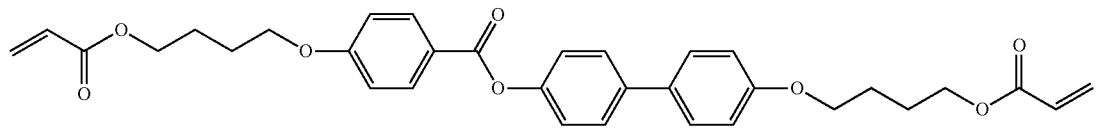

L3
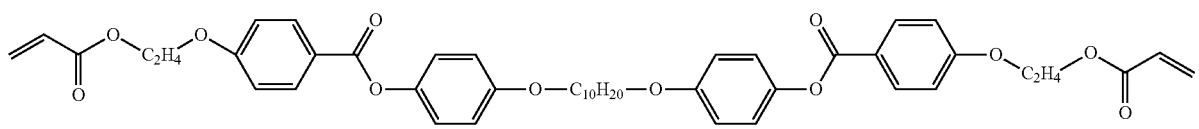

L4
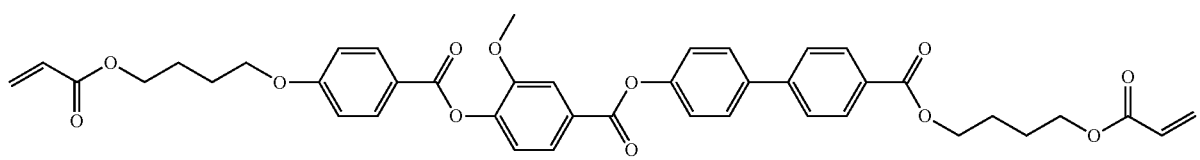

L5
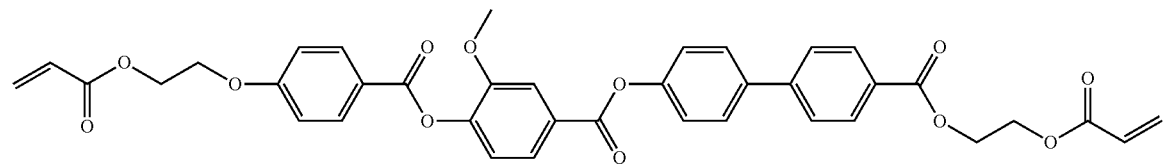

L6
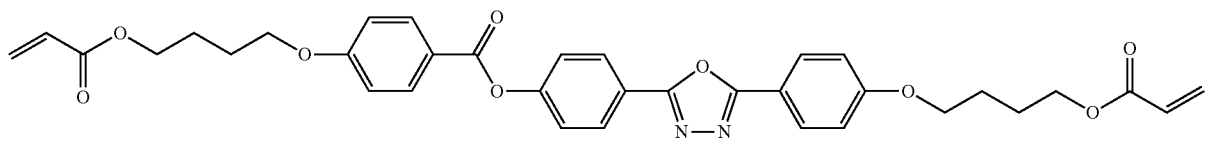

L7
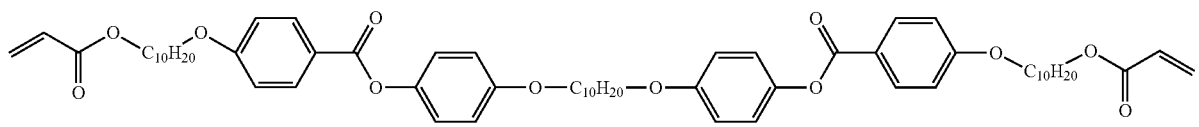

[Phase Transition Temperature]
[Liquid Crystal Compound]
The phase transition temperatures of the liquid crystal compounds used in Examples 1 to 7 and Comparative Examples 1 and 2 were measured by the method described below.

Two polarizers of an optical microscope (ECLIPSE E600 POL, manufactured by Nikon Corporation) were disposed so as to be orthogonal to each other, and a sample table was set between the two polarizers.

Further, a small amount of each liquid crystal compound was placed on slide glass, and the slide glass was set on a hot stage placed on the sample table. While observing the state of the sample using a microscope, the temperature of the hot stage was raised at 5° C./min, and the kind of the liquid crystal phase of the sample and the temperature at which the phase transition occurred were recorded.

The results are as follows. Further, K represents an individual, SmA represents a smectic A phase, SmB represents a smectic B phase, SmC represents a smectic C phase, N represents a nematic phase, Iso represents an isotropic phase, and ">200" means that the nematic phase is maintained up to 200° C. (phase transition does not occur).

<Results>
Liquid crystal compound L1: K 84 Sm 135 N 139 Iso
Liquid crystal compound L2: K 76 SmB 86 SmC 118 SmA 142 N 164 Iso Liquid crystal compound L3: K 99 SmA 120 Iso
Liquid crystal compound L4: K 60 SmA 157 N>200
Liquid crystal compound L5: K 101 SmA 126 N 190 Iso
Liquid crystal compound L6: K 99 SmA 108 N 125 Iso
Liquid crystal compound L7: K 82 SmA 114 Iso

[Polarizer-Forming Composition]

The phase transition temperatures of the compositions for forming a polarizer prepared in Examples 1 to 7 and Comparative Examples 1 and 2 were measured by the method described below. The results are listed in Table 2.

Two polarizers of an optical microscope (ECLIPSE E600 POL, manufactured by Nikon Corporation) are disposed so as to be orthogonal to each other, and a sample table is set between the two polarizers.

Further, a small amount of the polarizer-forming composition is placed on slide glass, and the slide glass is set on a hot stage placed on the sample table.

The composition is observed using a microscope while the temperature of the hot stage is raised from 25° C. at 5° C./min, and the temperature at which phase transition from the crystal phase to the smectic phase has occurred and the temperature at which phase transition from the smectic phase to the nematic phase or the isotropic phase has occurred from the texture are recorded.

[Evaluation]

The following evaluations were performed on the polarizers and the laminates of the examples and the comparative examples which were obtained in the above-described manner.

[Degree of Alignment]

Each laminate prepared in the examples and the comparative examples was set on the sample table in a state in which a linear polarizer was inserted on a light source side of an optical microscope (product name, "ECLIPSE E600 POL", manufactured by Nikon Corporation), the absorbance of the polarizer in a wavelength range of 380 nm to 780 nm was measured at a pitch of 1 nm using a multi-channel spectrometer (product name, "QE65000", manufactured by Ocean Optics, Inc.), and an average value of the degrees of alignment in a wavelength range of 400 nm to 700 nm was calculated according to the following equation. The results are listed in Table 2.

Degree of alignment: $S=((Az0/Ay0)-1)/((Az0/Ay0)+2)$

Az0: Absorbance of polarizer with respect to polarized light in absorption axis direction
Ay0: Absorbance of polarizer with respect to polarized light in polarization axis direction

[Heat Resistance]

Each laminate prepared in the examples and the comparative examples was held in a heat-resistant oven at 100° C. and a heat-resistant oven at 85° C. for 50 hours. The laminate was taken out and cooled at room temperature, and the degree of alignment was measured by the above-described method. A difference in the degree of alignment before and after the holding in the heat-resistant oven was calculated, and the results from the evaluation performed by the following method are listed in Table 2.

A: Change in the degree of alignment under a temperature condition of 100° C. was less than 10%

B: Change in the degree of alignment under a temperature condition of 100° C. was 10% or greater, and change in the degree of alignment under a temperature condition of 85° C. was less than 10%

C: Change in the degree of alignment under a temperature condition of 85° C. was greater than or equal to 10% and less than 30%

D: Change in the degree of alignment under a temperature condition of 85° C. was 30% or greater

[Light Fastness]

The side of each laminate, prepared in the examples and the comparative examples, opposite to the polarizer was irradiated with xenon light at an irradiation dose of 150 W/m$^2$ (300 to 400 nm) for 100 hours using a super xenon weather meter "SX-75" (manufactured by Suga Test Instruments Co., Ltd., under conditions of 60° C. and 50% RH). After a lapse of a predetermined time, a change in the degree of polarization of the laminate was measured. The evaluation results are listed in Table 2.

A: Change in the degree of polarization was less than 5%

B: Change in the degree of polarization was greater than or equal to 5% and less than 10%

C: Change in the degree of polarization was 10% or greater

[Haze]

The results obtained by visually evaluating the haze of each laminate prepared in the examples and the comparative examples according to the following method are listed in Table 2.

A: Haze was not visually recognized on the entire surface

B: A small amount of haze was recognized on a part of the surface

C: An extremely small amount of haze was visually recognized on the entire surface, or white turbidity was visually recognized on a part of the surface D: White turbidity was visually recognized on the entire surface

TABLE 1

| | Liquid crystal compound | | Dichroic material | | Dichroic material | | Dichroic material | | Polymerization initiator | | Interface modifier | | Chloroform | Cyclopentanone |
|---|---|---|---|---|---|---|---|---|---|---|---|---|---|---|
| | Type | Parts by mass | Type | Parts by mass | Type | Parts by mass | Type | Parts by mass | Type | Parts by mass | Type | Parts by mass | Parts by mass | Parts by mass |
| Example 1 | L1 | 5.350 | Y1 | 0.122 | M1 | 0.182 | C1 | 0.243 | F1 | 0.049 | J1 | 0.055 | 84.600 | 9.400 |
| Example 2 | L2 | 5.350 | Y1 | 0.122 | M1 | 0.182 | C1 | 0.243 | F1 | 0.049 | J1 | 0.055 | 84.600 | 9.400 |
| Example 3 | L2 | 5.350 | Y1 | 0.122 | M1 | 0.182 | C1 | 0.243 | F1 | 0.049 | J1 | 0.055 | 84.600 | 9.400 |
| Example 4 | L3 | 5.350 | Y1 | 0.122 | M1 | 0.182 | C1 | 0.243 | F1 | 0.049 | J1 | 0.055 | 84.600 | 9.400 |
| Example 5 | L5 | 5.350 | Y1 | 0.122 | M1 | 0.182 | C1 | 0.243 | F1 | 0.049 | J1 | 0.055 | 84.600 | 9.400 |
| Example 6 | L4 | 5.350 | Y1 | 0.122 | M1 | 0.182 | C1 | 0.243 | F1 | 0.049 | J1 | 0.055 | 84.600 | 9.400 |
| Example 7 | L4 | 5.248 | Y1 | 0.131 | M1 | 0.197 | C1 | 0.350 | F1 | 0.035 | J1 | 0.039 | 84.600 | 9.400 |
| Comparative Example 1 | L6 | 5.350 | Y1 | 0.122 | M1 | 0.182 | C1 | 0.243 | F1 | 0.049 | J1 | 0.055 | 84.600 | 9.400 |
| Comparative Example 2 | L7 | 5.350 | Y1 | 0.122 | M1 | 0.182 | C1 | 0.243 | F1 | 0.049 | J1 | 0.055 | 84.600 | 9.400 |

TABLE 2

| | Polarizer-forming composition | | | | Conditions for preparation | | | | Durability | | |
|---|---|---|---|---|---|---|---|---|---|---|---|
| | Transition temperature from crystal phase to liquid crystal layer | Transition temperature from Sm phase to N phase or isotropic phase | Sm phase Temperature range | N phase Temperature range | Heating temperature °C. | Cooling rate °C./s | Exposure amount mJ/cm$^2$ | Degree of alignment | Heat resistance | Light fastness | Haze |
| Example 1 | 80 | SmA129N | 51 | 6 | 135 | 6.0 | 1000 | 0.91 | B | B | B |
| Example 2 | 70 | SmA133N | 22 | 20 | 150 | 6.3 | 1000 | 0.90 | A | B | B |
| Example 3 | 70 | SmA133N | 22 | 20 | 150 | 1.0 | 1000 | 0.93 | A | B | D |
| Example 4 | 92 | SmA120Iso | 20 | 0 | 96 | 3.6 | 1000 | 0.84 | C | B | D |
| Example 5 | 97 | SmA121N | 20 | 61 | 130 | 5.3 | 1000 | 0.92 | B | B | A |
| Example 6 | 55 | SmA126N | 85 | >50 | 155 | 6.5 | 1000 | 0.93 | B | B | A |
| Example 7 | 54 | SmA126N | 85 | >50 | 155 | 6.5 | 1000 | 0.94 | B | A | A |
| Comparative Example 1 | 93 | SmA104N | 9 | 16 | 115 | 4.5 | 1000 | 0.86 | D | C | B |
| Comparative Example 2 | 77 | Sm111N | 32 | — | 110 | 4.3 | 1000 | 0.84 | D | C | C |

Based on the results listed in Table 2, it was found that since the heat resistances of the polarizer and laminate to be prepared were deteriorated in Comparative Examples 1 and 2 in which the phase transition temperature of the polarizer-forming composition from the smectic phase to the isotropic phase or the nematic phase was lower than 120° C., both the degree of alignment and heat resistance were not able to be achieved.

On the contrary, it was found that the heat resistances of the polarizer and laminate to be prepared were satisfactory in Examples 1 to 7 in which the phase transition temperature of the polarizer-forming composition from the smectic phase to the isotropic phase or the nematic phase was 120° C. or higher, both the degree of alignment and heat resistance were able to be achieved.

Further, based on the comparison between Example 4 and other examples, it was found that in a case where the liquid crystal compound had a nematic liquid crystallinity, the degree of alignment and heat resistance of the polarizer and laminate to be prepared were able to be achieved at higher levels.

Further, based on the comparison between Examples 1 to 3 and Examples 5 to 7, it was found that in a case where the difference between the upper limit and the lower limit in a range of temperature at which the nematic phase of the polarizer-forming composition was provided was 25° C. or higher, the haze of the polarizer and laminate to be prepared was suppressed.

What is claimed is:

1. A method of producing a polarizer, the method comprising:
   forming a coating film by coating an alignment film with a polarizer-forming composition which contains a liquid crystal compound and a dichroic material;
   wherein the liquid crystal compound has a smectic liquid crystallinity, and has a temperature at which phase transition from a crystal phase to a smectic phase has occurred;
   wherein a phase transition temperature of the polarizer-forming composition from a smectic phase to an isotropic phase or a nematic phase is 120° C. or higher;
   wherein a difference between an upper limit and a lower limit in a range of temperature at which the nematic phase of the polarizer-forming composition is provided is 25° C. to 61° C.;
   aligning a liquid crystal component contained in the coating film in a liquid crystal state;
   cooling the coating film to a temperature range of 20° C. to 25° C. at a cooling rate of 3° C/sec or greater from the liquid crystal state to obtain the polarizer; and
   curing the polarizer.
2. The method according to claim 1, wherein the phase transition temperature of the polarizer-forming composition from the smectic phase to the isotropic phase or a nematic phase is 130° C. or higher.
3. The method according to claim 1, wherein the liquid crystal compound further has a nematic liquid crystallinity.
4. The method according to claim 1, further comprising: forming a photo-alignment film as the alignment film before the coating film forming step.
5. The method according to claim 1, wherein a difference between an upper limit and a lower limit in a range of temperature at which the smectic phase of the polarizer-forming composition is provided is 50° C. or higher.

* * * * *